United States Patent
Adachi

[11] Patent Number: 6,111,469
[45] Date of Patent: Aug. 29, 2000

[54] CHARGE PUMPING CIRCUIT AND PLL FREQUENCY SYNTHESIZER

[75] Inventor: Masahiro Adachi, Tokyo, Japan

[73] Assignee: NEC Corporation, Tokyo, Japan

[21] Appl. No.: 09/137,144

[22] Filed: Aug. 20, 1998

[30] Foreign Application Priority Data

Aug. 20, 1997 [JP] Japan .................................... 9-223850

[51] Int. Cl.[7] .............................. H03L 7/085; H03L 7/089
[52] U.S. Cl. ................................ 331/17; 331/25; 327/157
[58] Field of Search ........................ 331/17, 25; 327/148, 327/157

[56] References Cited

U.S. PATENT DOCUMENTS

| | | | |
|---|---|---|---|
| 4,792,705 | 12/1988 | Ouyang et al. | 331/17 |
| 6,043,716 | 3/2000 | Warner | 331/17 |

FOREIGN PATENT DOCUMENTS

| | | |
|---|---|---|
| 55-10238 | 1/1980 | Japan . |
| 62-234415 | 10/1987 | Japan . |
| 1-128620 | 5/1989 | Japan . |
| 5-29847 | 2/1993 | Japan . |
| 6-13896 | 1/1994 | Japan . |
| 8-84041 | 3/1996 | Japan . |
| 8-204549 | 8/1996 | Japan . |
| 9-298462 | 11/1997 | Japan . |
| 11-46138 | 2/1999 | Japan . |

Primary Examiner—Siegfried H. Grimm
Attorney, Agent, or Firm—Sughrue, Mion, Zinn, Macpeak & Seas, PLLC

[57] ABSTRACT

A charge pumping circuit includes a constant current source, a switch element, a first MOS transistor, a second MOS transistor, and a switching-off circuit. The constant current source generates and outputs a current having a constant current value. The switch element is turned on and outputs a current determined by the constant current source when an input signal is active. The first MOS transistor flows the current output from the switch element. The second MOS transistor constitutes a current mirror circuit together with the first MOS transistor, and outputs a current having a current value based on the current flowing through the first MOS transistor, as one of charge and discharge currents. The switching-off circuit turns off the second MOS transistor by charging or discharging the gate when the input signal is inactive.

10 Claims, 6 Drawing Sheets

CHARGE PUMPING CIRCUIT AND PLL FREQUENCY SYNTHESIZER

BACKGROUND OF THE INVENTION

The present invention relates to a charge pumping circuit and a PLL (Phase-Locked Loop) frequency synthesizer having the charge pumping circuit and, more particularly, to a charge pumping circuit for outputting a control voltage for controlling a voltage-controlled oscillator to oscillate at a target frequency.

Figure 3:
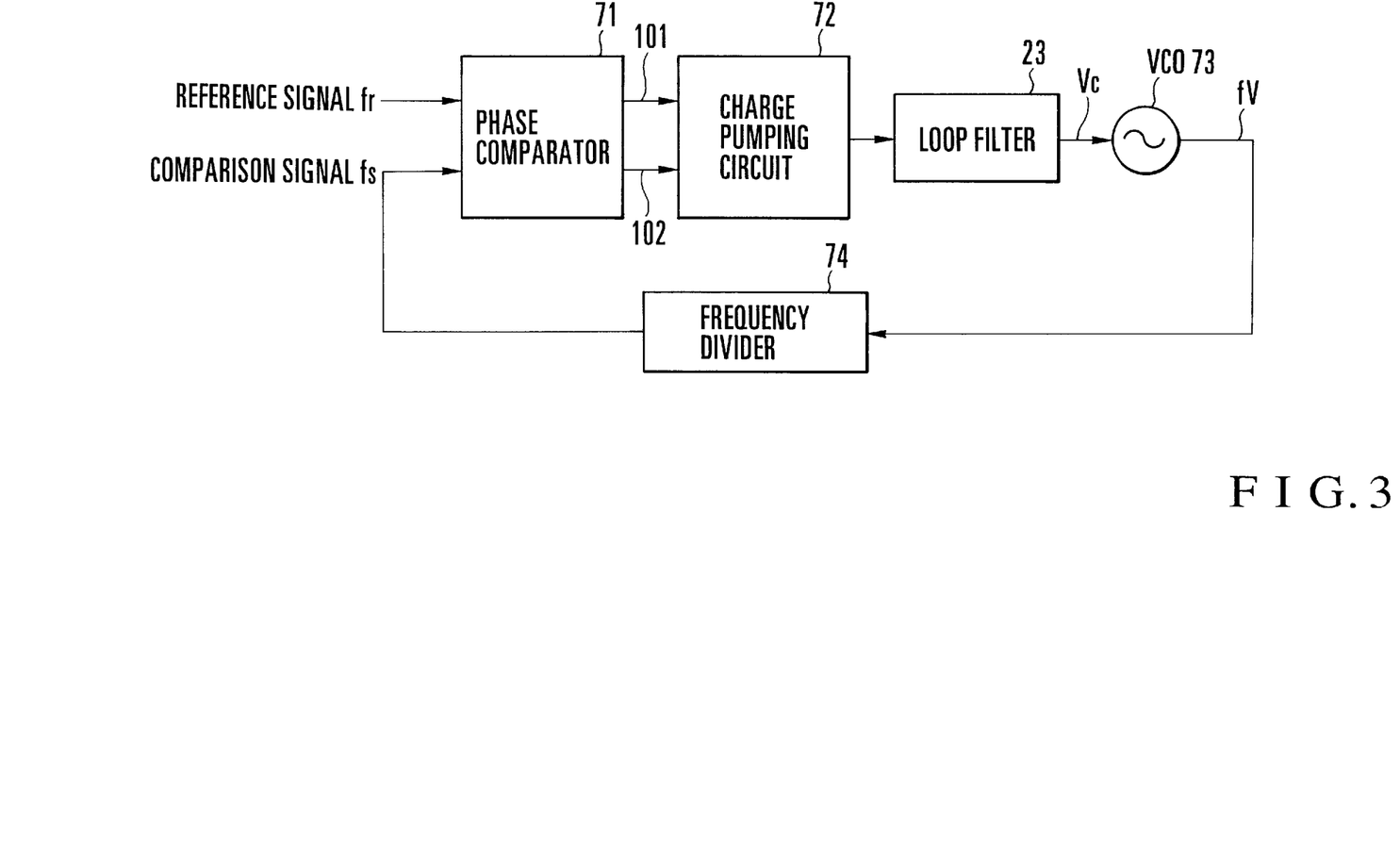
FIG. 3 is a block diagram showing the arrangement of a PLL frequency synthesizer.

FIG. 3 shows a PLL frequency synthesizer having a charge pumping circuit.

The PLL frequency synthesizer comprises a phase comparator 71, a charge pumping circuit 72, a loop filter 23, a voltage-controlled oscillator 73, and a frequency divider 74.

The phase comparator 71 detects the phase difference between a comparison signal fs and a reference signal fr. When the phase of the comparison signal delays from that of the reference signal, the phase comparator 71 outputs a phase error/up signal 101. When the phase of the comparison signal advances from that of the reference signal, the phase comparator 71 outputs a phase error/down signal 102.

The charge pumping circuit 72 charges the loop filter 23 upon reception of the phase error/up signal 101 and discharges it upon reception of the phase error/down signal 102.

Based on the charge and discharge currents output from the charge pumping circuit 72, the loop filter 23 generates and outputs a control voltage Vc for causing the voltage-controlled oscillator 73 to oscillate at a target frequency.

The voltage-controlled oscillator (VCO) 73 outputs, as an oscillation output signal fv, a signal whose frequency is controlled by the control voltage Vc. The frequency divider 74 divides the frequency of the oscillation output signal fv and outputs the comparison signal fs to the phase comparator 71.

This PLL frequency synthesizer operates to make the comparison signal fs in phase with the reference signal fr, and controls the voltage-controlled oscillator 73 to oscillate at a target frequency.

The arrangement of the conventional charge pumping circuit 72 shown in FIG. 3 will be described with reference to FIG. 4.

Figure 4:
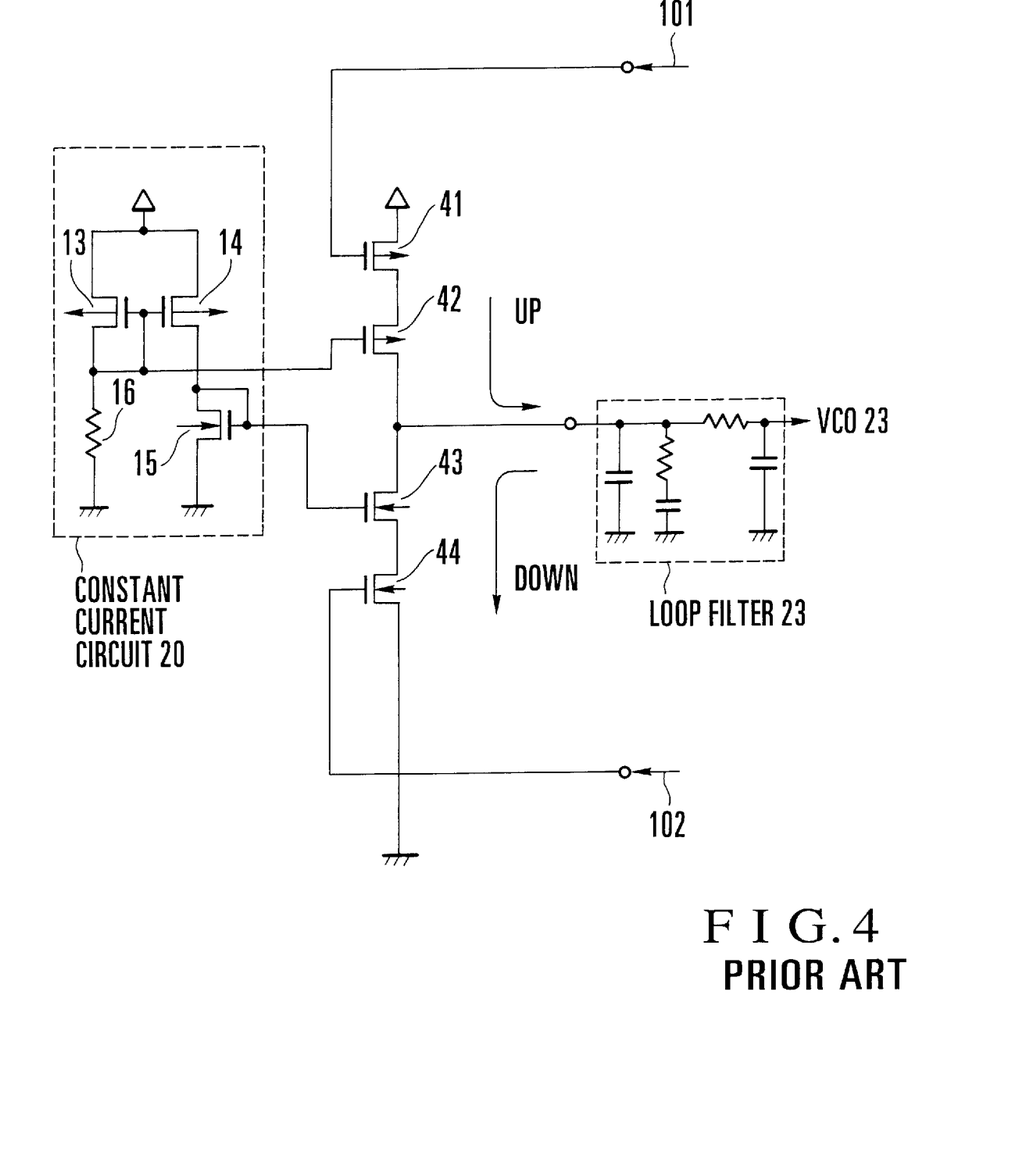
FIG. 4 is a circuit diagram showing a conventional charge pumping circuit.

The charge pumping circuit shown in FIG. 4 comprises a constant current source 20, the loop filter 23, p-channel MOS transistors 41 and 42, and n-channel MOS transistors 43 and 44.

The constant current source 20 is constituted by p-channel MOS transistors 13 and 14, an n-channel MOS transistor 15, and a resistor 16, and generates and outputs a constant current. The p- and n-channel MOS transistors 42 and 43 output the current generated by the constant current source 20.

The source of the p-channel MOS transistor 41 is connected to the power supply, its gate receives the phase error/up signal 101, and its drain is connected to the source of the p-channel MOS transistor 42. When the phase error/up signal 101 becomes active (low level), the p-channel MOS transistor 41 is turned on and outputs the current determined by the p-channel MOS transistor 42 as a charge current $I_{UP}$ to the loop filter 23.

The source of the n-channel MOS transistor 44 is grounded, its gate receives the phase error/down signal 102, and its drain is connected to the source of the n-channel MOS transistor 43. When the phase error/down signal 102 becomes active (high level), the n-channel MOS transistor 44 is turned on and discharges the current determined by the n-channel MOS transistor 43 as a discharge current $I_{DOWN}$ from the loop filter 23.

The loop filter 23 is charged and discharged by the charge current $I_{UP}$ and the discharge current $I_{DOWN}$, generates the control voltage, and outputs it to the VCO.

The operation of the conventional charge pumping circuit having this arrangement will be explained.

In the charge pumping circuit shown in FIG. 4, when the phase error/up signal 101 becomes active, the p-channel MOS transistor 41 is turned on. Then, the charge current $I_{UP}$ determined by the p-channel MOS transistor 42 is output to the loop filter 23 to increase the control voltage output from the loop filter 23.

When the phase error/down signal 102 becomes active, the n-channel MOS transistor 44 is turned on. Then, the discharge current $I_{DOWN}$ determined by the n-channel MOS transistor 43 is discharged from the loop filter 23 to decrease the control voltage output from the loop filter 23.

In this charge pumping circuit, the phase error/up or down signal 101 or 102 makes a source potential $V_{GS}$ of the p- or n-channel MOS transistor 42 or 43 change via the gate diffusion capacity of the p- or n-channel MOS transistor 41 or 44.

Figure 5A:
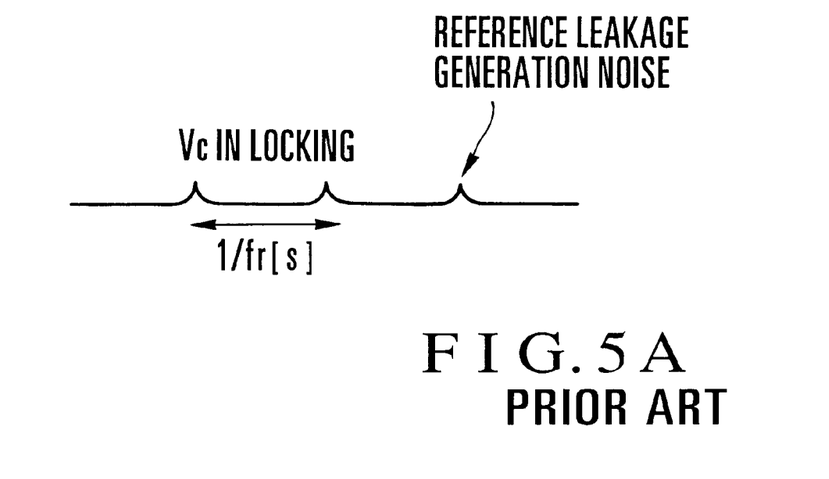
FIG. 5A is a waveform chart for explaining noise superposed on a control voltage shown in FIG. 4.
Figure 5B:
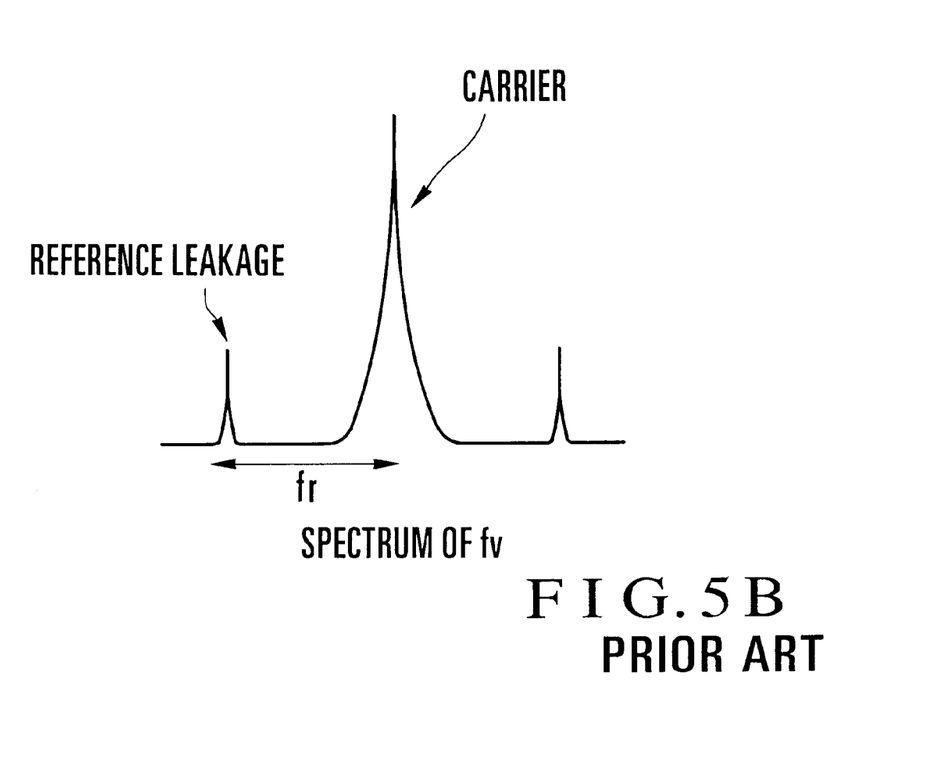
FIG. 5B is a waveform chart for explaining the frequency spectrum of an oscillation output signal.

The charge current $I_{UP}$ and the discharge current $I_{DOWN}$ respectively determined by the MOS transistors 42 and 43 fluctuate. Accordingly, noise is superposed on the control voltage Vc output from the loop filter 23 at an interval of 1/reference signal frequency fr, as shown in FIG. 5A. The spectrum of the oscillation output signal fv from the VCO controlled by the noise-superposed control voltage Vc is measured to confirm that reference leakage caused by the reference frequency component is superposed on the signal fv, as shown in FIG. 5B.

In this charge pumping circuit, a constant current output voltage $V_{DS}$ between the drain and source of the p- and n-channel MOS transistors 42 and 43 depends on the state of the control voltage Vc. For this reason, the current gain varies, and the settling time is unstable.

Another example of the charge pumping circuit for suppressing variations in current gain will be described with reference to FIG. 6. The same reference numerals as in FIG. 4 denote the same parts, and a description thereof will be omitted.

Figure 6:
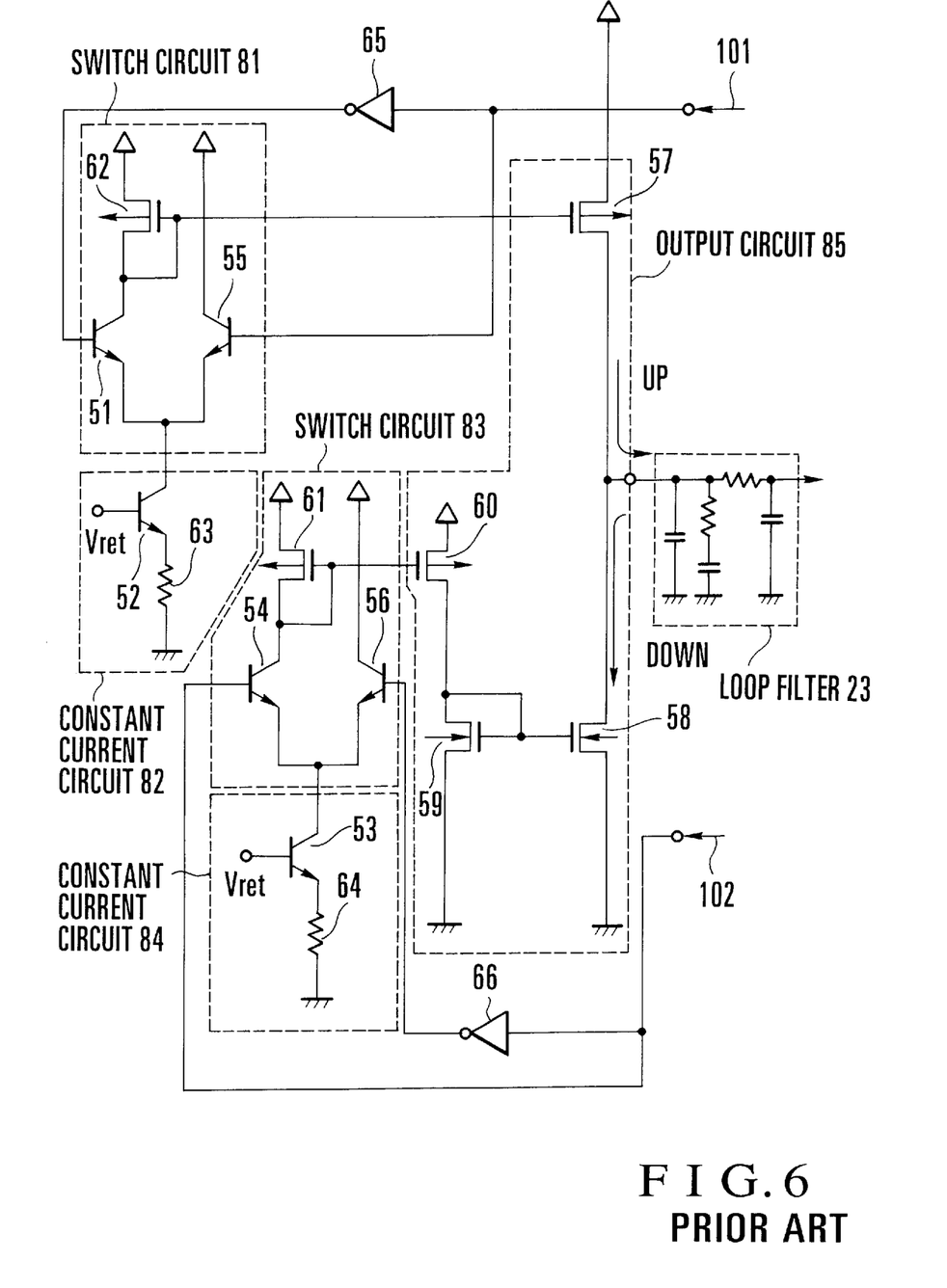
FIG. 6 is a circuit diagram showing another conventional charge pumping circuit.

The charge pumping circuit shown in FIG. 6 comprises a first switching circuit 81, a first current source 82, a second switching circuit 83, a second current source 84, an output circuit 85, and inverters 65 and 66.

The first switching circuit 81 is constituted by a p-channel MOS transistor 62, and npn transistors 51 and 55. The first current source 82 is constituted by an npn transistor 52 and a resistor 63. The second switching circuit 83 is constituted by a p-channel MOS transistor 61, and npn transistors 54 and 56. The second current source 84 is constituted by an npn transistor 53 and a resistor 64. The output circuit 85 is constituted by p-channel MOS transistors 57 and 60, and n-channel MOS transistors 58 and 59.

The inverter 65 inverts the logic level of the phase error/up signal 101 and outputs the inverted signal to the first switching circuit 81. The inverter 66 inverts the logic level of the phase error/down signal 102 and outputs the inverted signal to the second switching circuit 83.

In the first switching circuit 81, the source of the p-channel MOS transistor 62 is connected to the power supply; its drain, to the collector of the npn transistor 51; and its gate, to its drain and the gate of the p-channel MOS transistor 57. The collector of the npn transistor 55 is connected to the power supply, its base receives the phase error/up signal 101, and its emitter is connected to the emitter of the npn transistor 51. The base of the npn transistor 51 receives an output from the inverter 65.

In the first current source 82, the collector of the npn transistor 52 is connected to the emitters of the npn transistors 51 and 55, its emitter is grounded via the resistor 63, and its base receives a reference voltage Vref.

In the second switching circuit 83, the source of the p-channel MOS transistor 61 is connected to the power supply; its drain, to the collector of the npn transistor 54; and its gate, to its drain and the gate of the p-channel MOS transistor 60. The collector of the npn transistor 56 is connected to the power supply, its base receives an output from the inverter 66, and its emitter is connected to the emitter of the npn transistor 54. The base of the npn transistor 54 receives the phase error/down signal 102.

In the second current source 84, the collector of the npn transistor 53 is connected to the emitters of the npn transistors 54 and 56, its emitter is grounded via the resistor 64, and its base receives the reference voltage Vref.

In the output circuit 85, the source of the p-channel MOS transistor 57 is connected to the power supply; and its drain, to the loop filter 23. The p-channel MOS transistor 57 constitutes a current mirror circuit together with the p-channel MOS transistor 62. The p-channel MOS transistor 57 outputs, as the charge current $I_{UP}$ to the loop filter 23, a current having a current value based on the current flowing through the source and drain of the p-channel MOS transistor 62.

The source of the p-channel MOS transistor 60 is connected to the power supply; its source, to the power supply; and its drain, to the drain of the n-channel MOS transistor 59. The p-channel MOS transistor 60 constitutes a current mirror circuit together with the p-channel MOS transistor 61. A current having a current value based on the current flowing through the source and drain of the p-channel MOS transistor 61 flows through the source and drain of the p-channel MOS transistor 60.

The drain of the n-channel MOS transistor 59 is connected to the drain of the p-channel MOS transistor 60, the source of the transistor 59 is grounded, and its gate is connected to its drain and the gate of the n-channel MOS transistor 58.

The source of the n-channel MOS transistor 58 is grounded, its gate is connected to the gate of the n-channel MOS transistor 59, and the drain of the transistor 58 is to the drain of the p-channel MOS transistor 57 and the loop filter 23. The n-channel MOS transistor 58 constitutes a current mirror circuit together with the n-channel MOS transistor 59. The n-channel MOS transistor 58 outputs, as the discharge current $I_{DOWN}$ to the loop filter 23, a current having a current value based on the current flowing through the source and drain of the n-channel MOS transistor 59.

The operation of the charge pumping circuit having this arrangement will be described.

When the phase error/up signal 101 becomes active (low level), the inverter 65 outputs a high-level signal, and the differential amplifier made up of the npn transistors 51 and 55 operates to flow the current determined by the current source formed by the npn transistor 52 and the resistor 63. This constant current also flows through the source and drain of the p-channel MOS transistor 62. Then, a current having a current value based on the constant current flows as the charge current $I_{UP}$ through the source and drain of the p-channel MOS transistor 57, and is output to the loop filter 23.

When the phase error/down signal 102 becomes active (high level), the inverter 66 outputs a low-level signal, and the differential amplifier made up of the npn transistors 54 and 56 operates to flow the current determined by the current source formed by the npn transistor 53 and the resistor 64. This constant current also flows through the source and drain of the p-channel MOS transistor 61. Accordingly, a current having a current value based on the constant current flows through the source and drain of the p-channel MOS transistor 60 and the source and drain of the n-channel MOS transistor 59.

A current having a current value based on the current flowing through the source and drain of the n-channel MOS transistor 59 flows as the discharge current $I_{DOWN}$ through the source and drain of the n-channel MOS transistor 58, thereby discharging the loop filter 23.

In this charge pumping circuit, since the npn transistors 52 and 53 are not arranged on the output stage, the current gain does not depend on the output stage. Therefore, the settling time is stable, and the control voltage Vc does not decrease. Since the npn transistors 52 and 53 respectively constituting the current sources 82 and 84 are not arranged on the output stage, no output current fluctuates by the switching operation.

In this charge pumping circuit, however, when the npn transistor 51 or 54 is turned off, the gate of the p-channel MOS transistor 57 is not quickly charged, or the gate of the n-channel MOS transistor 58 is not quickly discharged. The p- and n-channel MOS transistors 57 and 58 require a long turn-off time. The output current (charge current $I_{UP}$ and discharge current $I_{DOWN}$) for the phase error signal has poor linearity. As a result, the reference leakage and the jitter increase.

In this charge pumping circuit, since the npn transistors 51 and 54 as bipolar transistors receive the phase error signal, they require a CMOS (Complementary Metal-Oxide Semiconductor)-ECL (Emitter Coupled Logic) level converter for connection to a general digital phase comparator, resulting in a large-scale circuit.

The above conventional charge pumping circuit suffers the following problems.

(1) Since the turn-off time of the output transistor is long, the output current linearity for the phase error signal is poor, and the reference leakage and the jitter are large.

(2) A CMOS-ECL level converter is required for connection to a general digital phase comparator.

SUMMARY OF THE INVENTION

It is an object of the present invention to provide a charge pumping circuit and a PLL frequency synthesizer in which the output current linearity can be maintained for a phase error signal.

It is an object of the present invention to provide a charge pumping circuit and a PLL frequency synthesizer capable of reducing the reference leakage without any special circuit for connection to a phase comparator.

In order to achieve the above objects, according to the present invention, there is provided a charge pumping circuit comprising a constant current source for generating and outputting a current having a constant current value, switch means which is turned on and outputs a current determined by the constant current source when an input signal is active, a first MOS transistor for flowing the current output from the switch means, a second MOS transistor which constitutes a current mirror circuit together with the first MOS transistor, and outputs a current having a current value based on the current flowing through the first MOS transistor, as one of charge and discharge currents, and switching-off means for turning off the second MOS transistor by charging or discharging a gate when the input signal is inactive.

DESCRIPTION OF THE PREFERRED EMBODIMENTS

The present invention will be described in detail below with reference to the accompanying drawings.
(First Embodiment)

Figure 1:
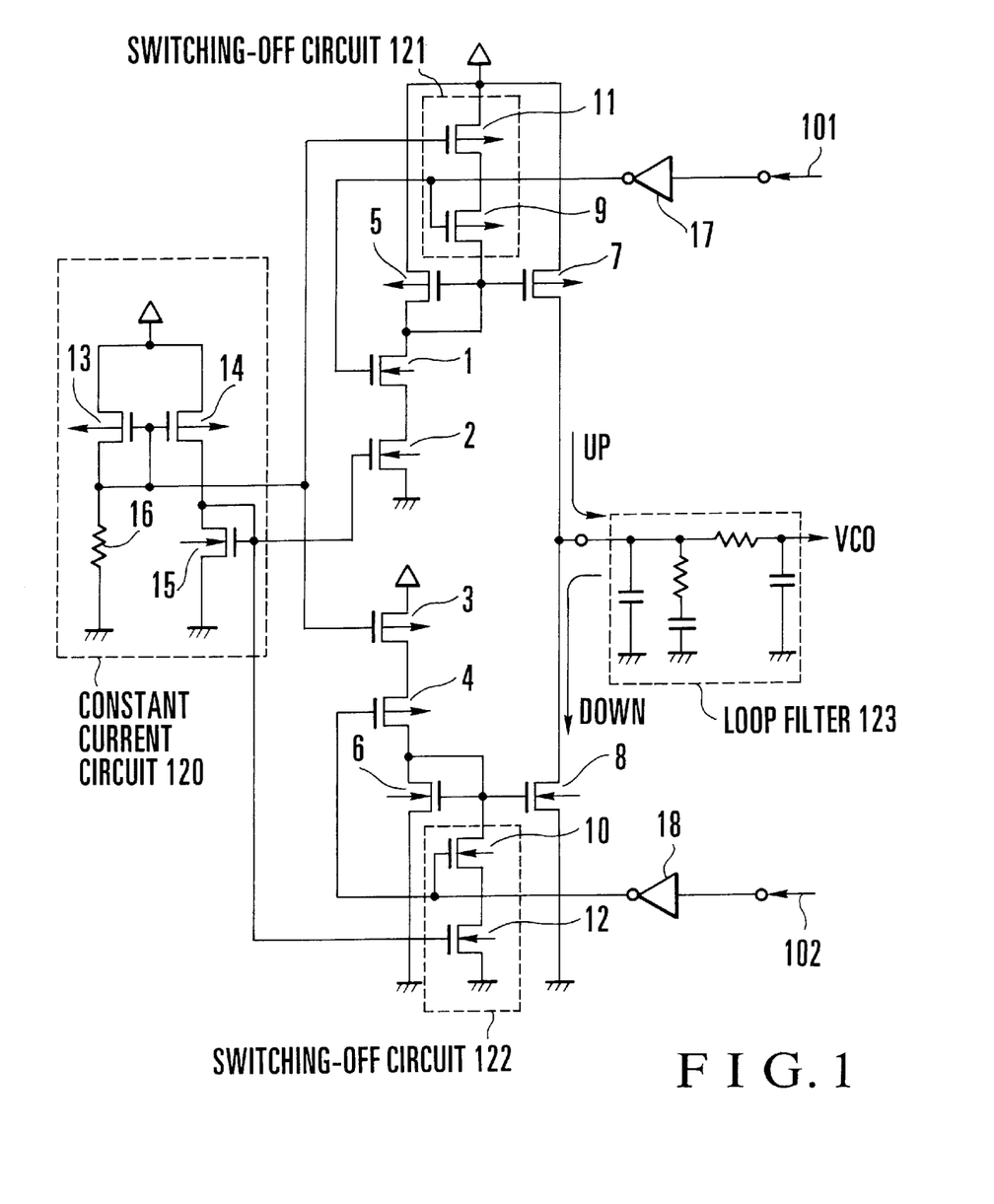
FIG. 1 is a circuit diagram showing a charge pumping circuit according to the first embodiment of the present invention.

FIG. 1 shows a charge pumping circuit according to the first embodiment of the present invention.

The charge pumping circuit of the first embodiment comprises a constant current source 120, n-channel MOS transistors 1, 2, 6, and 8, p-channel MOS transistors 3, 4, 5 and 7, switching-off circuits 121 and 122, and inverters 17 and 18.

The inverter 17 inverts the logic level of a phase error/up signal 101 and outputs the inverted signal to the switching-off circuit 121. The inverter 18 inverts the logic level of a phase error/down signal 102 and outputs the inverted signal to the switching-off circuit 122.

The gate of the n-channel MOS transistor 1 receives an output from the inverter 17, its drain is connected to the drain of the p-channel MOS transistor 5, and its source is to the drain of the n-channel MOS transistor 2. When the phase error/up signal 101 becomes active (low level), the n-channel MOS transistor 1 is turned on to flow the current determined by the n-channel MOS transistor 2 through the source and drain. The series circuit made up of the two MOS transistors 1 and 2 constitutes a constant current switching circuit.

The gate of the n-channel MOS transistor 2 is connected to the constant current source 120, and its source is grounded. The n-channel MOS transistor 2 outputs a constant current generated by the constant current source 120. The source of the p-channel MOS transistor 5 is connected to the power supply; and its gate, to its drain and the gate of the p-channel MOS transistor 7.

The switching-off circuit 121 is constituted by a p-channel MOS transistor 11 serving as a constant current element, and a p-channel MOS transistor 9 serving as a switching element. The source of the p-channel MOS transistor 11 is connected to the power supply; and its gate, to the constant current source 120. The gate of the p-channel MOS transistor 9 receives an output from the inverter 17, and its source and drain are connected to the drain of the p-channel MOS transistor 11 and the gate of the p-channel MOS transistor 7, respectively.

The source of the p-channel MOS transistor 7 is connected to the power supply; and its drain, to a loop filter 123. The p-channel MOS transistor 7 constitutes a current mirror circuit together with the p-channel MOS transistor 5.

The gate of the p-channel MOS transistor 4 receives an output from the inverter 18, and its drain and source are connected to the drain of the n-channel MOS transistor 6 and the drain of the p-channel MOS transistor 3, respectively. When the phase error/down signal 102 becomes active (high level), the p-channel MOS transistor 4 is turned on to flow the current determined by the p-channel MOS transistor 3 through the source and drain. The series circuit made up of the two MOS transistors 3 and 4 constitutes a constant current switching circuit.

The gate of the p-channel MOS transistor 3 is connected to the constant current source 120, and its source is grounded. The p-channel MOS transistor 3 outputs a constant current generated by the constant current source 120. The source of the n-channel MOS transistor 6 is grounded, and its gate is connected to its drain and the gate of the n-channel MOS transistor 8.

The switching-off circuit 122 is constituted by an n-channel MOS transistor 12 serving as a constant current element, and an n-channel MOS transistor 10 serving as a switching element. The source of the n-channel MOS transistor 12 is grounded, and its gate is connected to the constant current source 120. The gate of the n-channel MOS transistor 10 receives an output from the inverter 18, and its source and drain are connected to the drain of the n-channel MOS transistor 12 and the gate of the n-channel MOS transistor 8, respectively.

The source of the n-channel MOS transistor 8 is grounded, and its drain is connected to the loop filter 123 together with the drain of the p-channel MOS transistor 7. The n-channel MOS transistor 8 constitutes a current mirror circuit together with the n-channel MOS transistor 6.

The operation of the charge pumping circuit having this arrangement will be described.

The operation for an active (low-level) phase error/up signal 101 will be first explained. When the phase error/up signal 101 changes to low level, and an output from the inverter 17 changes to high level, the n-channel MOS transistor 1 is turned on to flow the current determined by the n-channel MOS transistor 2 through the p-channel MOS transistor 5. The p-channel MOS transistors 5 and 7 constitute a current mirror circuit. Accordingly, a charge current $I_{UP}$ having a current value based on the current flowing through the source and drain of the p-channel MOS transistor 5 flows through the source and drain of the p-channel MOS transistor 7, and is output to the loop filter 123.

When the phase error/up signal 101 changes from an active state (low level) to an inactive state (high level), and the output from the inverter 17 changes from high level to low level, the p-channel MOS transistor 9 of the switching-off circuit 121 is immediately turned on. Then, the gate of the p-channel MOS transistor 7 is charged by the current determined by the p-channel MOS transistor 11, and the p-channel MOS transistor 7 is turned off.

In this manner, the current is controlled by turning off the p-channel MOS transistor 7. This can shorten the time (turn-off time) required to turn off the p-channel MOS transistor 7 after the phase error/up signal 101 becomes inactive.

The operation for an active (high-level) phase error/down signal 102 will be explained.

When the phase error/down signal 102 changes to high level, and an output from the inverter 18 changes to low level, the p-channel MOS transistor 4 is turned on to flow the current determined by the p-channel MOS transistor 3 through the n-channel MOS transistor 6. The n-channel MOS transistors 6 and 8 constitute a current mirror circuit. Accordingly, a discharge current $I_{DOWN}$ having a current value based on the current flowing through the source and drain of the n-channel MOS transistor 6 flows through the source and drain of the n-channel MOS transistor 8 to discharge the loop filter 123.

When the phase error/down signal 102 changes from high level to low level, and the output from the inverter 18 changes from low level to high level, the n-channel MOS transistor 10 of the switching-off circuit 122 is immediately turned on. Then, the gate of the n-channel MOS transistor 8 is discharged by the current determined by the n-channel MOS transistor 12, and the n-channel MOS transistor 8 is turned off.

The current is controlled by turning off the n-channel MOS transistor 8. This can shorten the time (turn-off time) required to turn off the n-channel MOS transistor 8 after the phase error/down signal 102 becomes inactive.

In the first embodiment, since a constant current output voltage $V_{GS}$ between the gate and source of each MOS transistors 7 or 8 is free from any influence of the switching operation, the output constant current hardly fluctuates by the switching operation, and the reference leakage can be reduced.

The reference leakage was simulated by a computer using the charge pumping circuit of the first embodiment to confirm that the reference leakage was smaller by about 15 dB than the reference leakage in the conventional charge pumping circuit shown in FIG. 4.

In the first embodiment, the p- and n-channel MOS transistors 7 and 8 are controlled as power supply switches without any switching circuit and any constant current source on the output stage. The charge current $I_{UP}$ and the discharge current $I_{DOWN}$ as output currents have constant gains regardless of the output state.

The switching-off circuits 121 and 122 which are turned on for an inactive phase error signal and respectively charge and discharge the gate can shorten the turn-off times of the p- and n-channel MOS transistors 7 and 8. Consequently, the output current linearity for the phase error signal can be improved.

The charge pumping circuit of the first embodiment maintains excellent output current linearity for the phase error signal, and can thus reduce the reference leakage. Since the phase error signal is received by the MOS transistor, the charge pumping circuit does not require any special circuit for connection to a digital phase comparator operating with the TTL logic.

(Second Embodiment)

Figure 2:
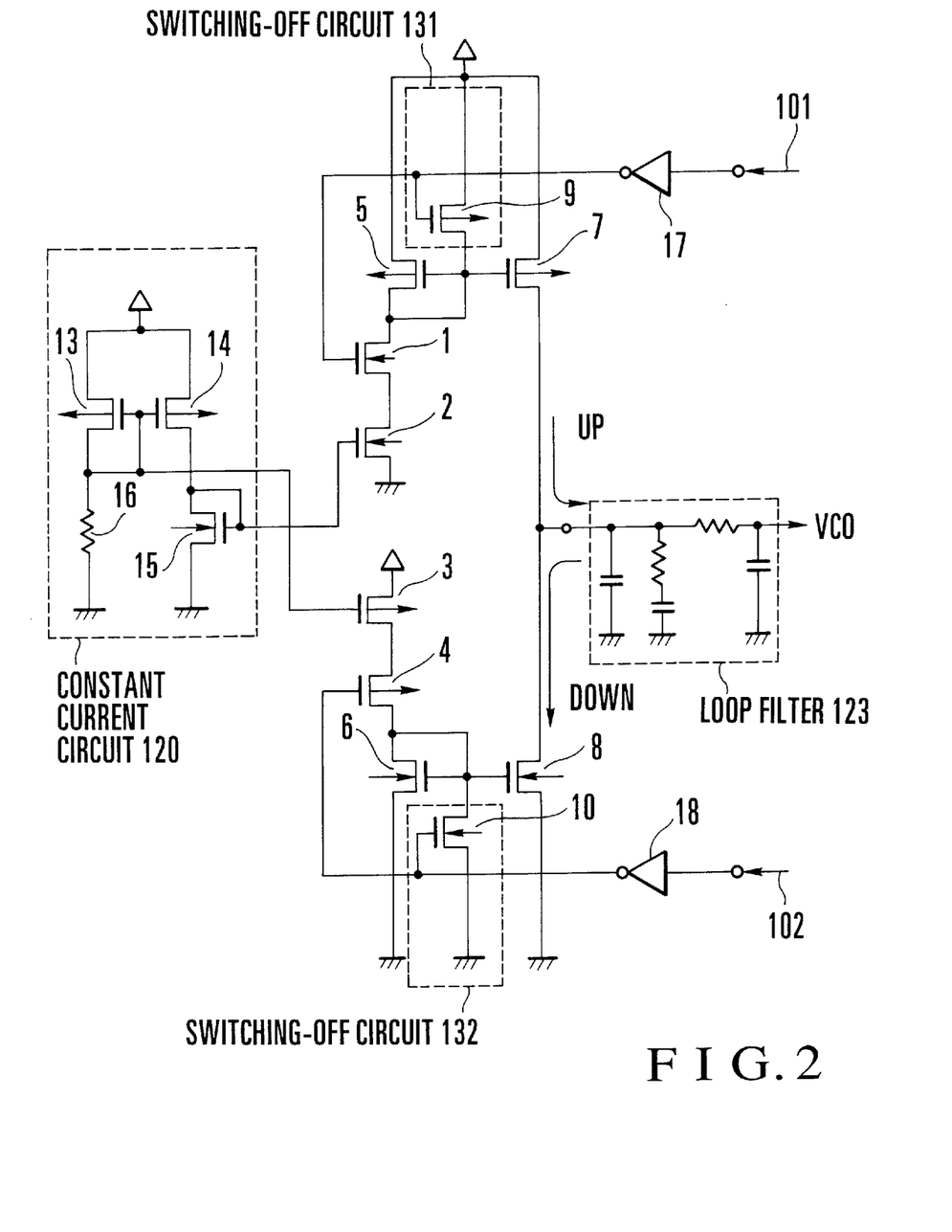
FIG. 2 is a circuit diagram showing a charge pumping circuit according to the second embodiment of the present invention.

FIG. 2 shows a charge pumping circuit according to the second embodiment of the present invention.

In the second embodiment, switching-off circuits 131 and 132 replace the switching-off circuits 121 and 122 of the first embodiment in FIG. 1.

The switching-off circuit 131 is constituted by only a p-channel MOS transistor 9 without using the p-channel MOS transistor 11, unlike the switching-off circuit 121. The switching-off circuit 132 is constituted by only an n-channel MOS transistor 10 without using the n-channel MOS transistor 12, unlike the switching-off circuit 122.

In the second embodiment, since the switching-off circuits 131 and 132 do not have any MOS transistor serving as a constant current source, switching noise may be superposed on the gate upon turning off the p- and n-channel MOS transistors 7 and 8. However, the second embodiment has the effect of constituting the switching-off circuits 131 and 132 with a smaller number of elements, in addition to the effects in the first embodiment. The charge pumping circuit can be used with negligible switching noise.

The first and second embodiments are applied to the charge pumping circuit 72 of the PLL frequency synthesizer shown in FIG. 3, and operate in the above-described manner. Note that the description of the phase comparator 71, the loop filter 23, the VCO 73, and the frequency divider 74 will be omitted.

As has been described above, the present invention has the following effects.

(1) Since $V_{GS}$ in the output MOS transistor for generating the charge or discharge current is free from any influence of the switching operation, the reference leakage can be reduced.

(2) Since the charge and discharge currents as output currents have constant gains regardless of the output state of the control voltage, a stable settling time can be realized.

(3) Since the switching-off circuit is arranged, excellent output current linearity can be maintained for the phase error signal, and the reference leakage can be reduced.

(4) Since the switching transistor for receiving the phase error signal is a MOS transistor, no special circuit is required for connection to a digital phase comparator, and the circuit scale can be reduced.

What is claimed is:

1. A charge pumping circuit comprising:

a constant current source for generating and outputting a current having a constant current value;

switch means which is turned on and outputs a current determined by said constant current source when an input signal is active;

a first MOS transistor for flowing the current output from said switch means;

a second MOS transistor which constitutes a current mirror circuit together with said first MOS transistor, and outputs a current having a current value based on the current flowing through said first MOS transistor, as one of charge and discharge currents; and switching-off means for turning off said second MOS transistor by charging or discharging a gate when the input signal is inactive.

2. A circuit according to claim 1, wherein said switching-off means comprises:

a constant current element for generating a current having a constant current value on the basis of the current from said constant current source; and a switching element which is turned on and outputs the current generated by said constant current element to a gate of said second MOS transistor when the input signal becomes inactive.

3. A circuit according to claim 2, wherein said constant current element and said switching element are respectively constituted by third and fourth MOS transistors.

4. A circuit according to claim 1, wherein said switching-off means comprises:

a switching element which is turned on and outputs a current to a gate of said second MOS transistor when the input signal becomes inactive.

5. A circuit according to claim 4, wherein said switching element is constituted by a third MOS transistor.

6. A circuit according to claim 1, wherein said switch means comprises:
- a third MOS transistor for generating a current having a constant current value on the basis of the current from said constant current source; and
- a fourth MOS transistor which is turned on and supplies the current generated by said third MOS transistor to said first MOS transistor and said switching-off means when a phase error signal becomes inactive.

7. A circuit according to claim 6, wherein gates of said first and second MOS transistors are connected to each other,
- said switching-off means is connected between the gate of said first MOS transistor and a power supply, and
- a drain of said fourth MOS transistor is connected to the drain and gate of said first MOS transistor.

8. A PLL frequency synthesizer comprising:
- a phase comparator for detecting a phase difference between a comparison signal and a reference signal, when a phase of the comparison signal delays from a phase of the reference signal, outputting a phase error/up signal, and when the phase of the comparison signal advances from the phase of the reference signal, outputting a phase error/down signal;
- a charge pumping circuit for outputting charge and discharge currents on the basis of the phase error/up signal and the phase error/down signal from said phase comparator;
- a loop filter for generating a control voltage on the basis of the charge and discharge currents output from said charge pumping circuit;
- a voltage-controlled oscillator for outputting, as an oscillation output signal, a signal whose frequency is controlled by the control voltage from said loop filter; and
- a frequency divider for outputting, to said phase comparator, a comparison signal obtained by dividing a frequency of the oscillation output signal from said voltage-controlled oscillator, said charge pumping circuit having
- a constant current source for generating and outputting a current having a constant current value,
- switch means which is turned on and outputs a current determined by said constant current source when the phase error/up signal and the phase error/down signal are active,
- a first MOS transistor for flowing the current output from said switch means,
- a second MOS transistor which constitutes a current mirror circuit together with said first MOS transistor, and outputs a current having a current value based on the current flowing through said first MOS transistor, as one of charge and discharge currents, and
- switching-off means for turning off said second MOS transistor by charging or discharging a gate when the phase error/up signal and the phase error/down signal are inactive.

9. A synthesizer according to claim 8, wherein said switching-off means comprises:
- a constant current element for generating a current having a constant current value on the basis of the current from said constant current source; and
- a switching element which is turned on and outputs the current generated by said constant current element to a gate of said second MOS transistor when the phase error/up signal and the phase error/down signal become inactive.

10. A synthesizer according to claim 8, wherein said switching-off means comprises:
- a switching element which is turned on and outputs a current to a gate of said second MOS transistor when the phase error/up signal and the phase error/down signal become inactive.

* * * * *